(12) United States Patent
Zhang et al.

(10) Patent No.: US 10,872,551 B2
(45) Date of Patent: Dec. 22, 2020

(54) SHIFT REGISTER UNIT AND CONTROL METHOD THEREOF, GATE DRIVE CIRCUIT AND DISPLAY DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Zhen Zhang, Beijing (CN); Zhengwei Zhu, Beijing (CN); Wencheng Hu, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 55 days.

(21) Appl. No.: 16/470,144

(22) PCT Filed: Dec. 7, 2018

(86) PCT No.: PCT/CN2018/119708
§ 371 (c)(1),
(2) Date: Jun. 14, 2019

(87) PCT Pub. No.: WO2019/153864
PCT Pub. Date: Aug. 15, 2019

(65) Prior Publication Data
US 2020/0357318 A1    Nov. 12, 2020

(30) Foreign Application Priority Data
Feb. 12, 2018    (CN) .......................... 2018 1 0147132

(51) Int. Cl.
| G11C 19/28 | (2006.01) |
| G09G 3/36 | (2006.01) |
| G09G 3/20 | (2006.01) |

(52) U.S. Cl.
CPC .............. *G09G 3/20* (2013.01); *G11C 19/28* (2013.01); *G09G 2300/0426* (2013.01);
(Continued)

(58) Field of Classification Search
CPC ............ G09G 3/20; G09G 2300/0426; G09G 2310/08; G09G 2310/0267; G09G 2310/0286
See application file for complete search history.

(56) References Cited

U.S. PATENT DOCUMENTS

| 10,217,430 B1 | 2/2019 | L V |
| 2010/0164915 A1 | 7/2010 | Kim et al. |

(Continued)

FOREIGN PATENT DOCUMENTS

| CN | 103680453 A | 3/2014 |
| CN | 105931611 A | 9/2016 |

(Continued)

OTHER PUBLICATIONS

First Office Action and English language translation, CN Application No. 201810147132.5, dated Apr. 3, 2019, 13 pp.

(Continued)

*Primary Examiner* — Md Saiful A Siddiqui
(74) *Attorney, Agent, or Firm* — Myers Bigel, P.A.

(57) ABSTRACT

This disclosure provides a shift register unit that includes an input circuit, a reset circuit, an output circuit, a first pull-down control circuit, a second pull-down control circuit, a first pull-down circuit and a second pull-down circuit. This disclosure also provides a control method for the shift register unit, a gate drive circuit, a display substrate and a display device.

16 Claims, 7 Drawing Sheets

(52) U.S. Cl.
CPC .............. *G09G 2310/0267* (2013.01); *G09G 2310/0286* (2013.01); *G09G 2310/08* (2013.01)

(56) References Cited

U.S. PATENT DOCUMENTS

| | | | | |
|---|---|---|---|---|
| 2015/0002504 A1* | 1/2015 | Jo | ....................... | G09G 3/3677 345/213 |
| 2015/0279288 A1 | 10/2015 | Dai et al. | | |
| 2018/0025687 A1* | 1/2018 | Wang | .................. | G09G 3/3266 345/213 |
| 2018/0211606 A1* | 7/2018 | Zhang | ..................... | G09G 3/36 |

FOREIGN PATENT DOCUMENTS

| | | | |
|---|---|---|---|
| CN | 106710513 | A | 5/2017 |
| CN | 107578756 | A | 1/2018 |
| CN | 107610668 | A | 1/2018 |
| CN | 108597431 | A | 9/2018 |

OTHER PUBLICATIONS

International Search Report and Written Opinion of the International Searching Authority (with English language translation), International Application No. PCT/CN2018/119708, dated Feb. 28, 2019, 12 pp.

* cited by examiner

US 10,872,551 B2

SHIFT REGISTER UNIT AND CONTROL METHOD THEREOF, GATE DRIVE CIRCUIT AND DISPLAY DEVICE

CROSS REFERENCE TO RELATED APPLICATIONS

The present application is a 35 U.S.C. 371 national stage application of PCT International Application No. PCT/CN2018/119708, filed on Dec. 7, 2018, which claims the benefit of Chinese Patent Application No. 201810147132.5, filed on Feb. 12, 2018, the contents of which are incorporated herein by reference in their entireties.

TECHNICAL FIELD

This disclosure relates to the field of display technologies, in particular to a shift register unit and a control method thereof, a gate drive circuit, a display substrate and a display device.

BACKGROUND ART

In order to pursue costs reduction and frame narrowing of display devices, existing display panels are increasingly adopted gate driver on array (GOA) techniques, i.e., directly fabricating a gate drive circuit of a thin film transistor (TFT) on an array substrate, which saves the spatial occupation of IC bonding and fan-out regions, and reduces the costs of materials and manufacture processes and narrows the frame of the display panel.

As compared with chip on glass (COG) and chip on film (COF) techniques, the GOA techniques have incomparable advantages in terms of frame narrowing and costs reduction, and thus have been widely applied in products such as a mobile, a touch PC (TPC) and a notebook (NB).

SUMMARY

According to one aspect of this disclosure, a shift register unit is provided. The shift register unit comprises: an input circuit, a reset circuit, an output circuit, a first pull-down control circuit, a second pull-down control circuit, a first pull-down circuit and a second pull-down circuit; the input circuit is connected to an input terminal, a first voltage terminal and a pull-up node, and is configured to output a pre-output signal to the pull-up node based on an input signal from the input terminal and a first voltage signal from the first voltage terminal; the output circuit is connected to an output terminal, a clock signal terminal and the pull-up node, and is configured to control a potential of the output terminal based on a clock signal from the clock signal terminal and a potential of the pull-up node; the reset circuit is connected to a reset signal terminal, a second voltage terminal and the pull-up node, and is configured to output a pre-reset signal to the pull-up node based on a reset signal from the reset signal terminal and a second voltage signal from the second voltage terminal; the first pull-down control circuit is connected to a first control signal terminal, a pull-down signal terminal and the pull-up node, and is configured to output a third control signal to the first pull-down circuit based on a first control signal from the first control signal terminal, a pull-down signal from the pull-down signal terminal and the potential of the pull-up node, to control the first pull-down circuit to be switched on or off; the second pull-down control circuit is connected to a second control signal terminal, a pull-down signal terminal and the pull-up node, and is configured to output a fourth control signal to the second pull-down circuit based on a second control signal from the second control signal terminal, a pull-down signal from the pull-down signal terminal and the potential of the pull-up node, to control the second pull-down circuit to be switched on or off; the first pull-down circuit is connected to the second control signal terminal, the first pull-down control circuit, the pull-up node and the output terminal, and is configured to control potentials of the pull-up node and the output terminal based on the second control signal responsive to the first pull-down circuit being switched on by the third control signal; the second pull-down circuit is connected to the first control signal terminal, the second pull-down control circuit, the pull-up node and the output terminal, and is configured to control potentials of the pull-up node and the output terminal based on the first control signal responsive to the second pull-down circuit being switched on by the fourth control signal; wherein the first pull-down circuit and the second pull-down circuit are alternatingly switched on.

In an embodiment, the first control signal and the second control signal have opposite phases, and the first control signal and the second control signal have a same period.

In an embodiment, the first pull-down circuit comprises a first transistor and a second transistor, wherein a control electrode of the first transistor is connected to the first pull-down control circuit, a first electrode of the first transistor is connected to the pull-up node, a second electrode of the first transistor is connected to the second control signal terminal, and a control electrode of the second transistor is connected to the first pull-down control circuit, a first electrode of the second transistor is connected to the output terminal, a second electrode of the second transistor is connected to the second control signal terminal.

In an embodiment, the second pull-down circuit comprises a third transistor and a fourth transistor, wherein a control electrode of the third transistor is connected to the second pull-down control circuit, a first electrode of the third transistor is connected to the pull-up node, a second electrode of the third transistor is connected to the first control signal terminal, and a control electrode of the fourth transistor is connected to the second pull-down control circuit, a first electrode of the fourth transistor is connected to the output terminal, a second electrode of the fourth transistor is connected to the first control signal terminal.

In an embodiment, the first pull-down control circuit comprises a fifth transistor and a sixth transistor, wherein a control electrode and a first electrode of the fifth transistor are both connected to the first control signal terminal, a second electrode of the fifth transistor is connected to the first pull-down circuit, and a control electrode of the sixth transistor is connected to the pull-up node, a first electrode of the sixth transistor is connected to the first pull-down circuit, a second electrode of the sixth transistor is connected to the pull-down signal terminal.

In an embodiment, the second pull-down control circuit comprises a seventh transistor and an eighth transistor, wherein a control electrode and a first electrode of the seventh transistor are both connected to the second control signal terminal, a second electrode of the seventh transistor is connected to the second pull-down circuit, and a control electrode of the eighth transistor is connected to the pull-up node, a first electrode of the eighth transistor is connected to the second pull-down circuit, a second electrode of the eighth transistor is connected to the pull-down signal terminal.

In an embodiment, the input circuit comprises a ninth transistor, wherein a control electrode of the ninth transistor is connected to the input terminal, a first electrode of the ninth transistor is connected to the first voltage terminal, a second electrode of the ninth transistor is connected to the pull-up node.

In an embodiment, the output circuit comprises a tenth transistor and a capacitor, wherein a control electrode of the tenth transistor is connected to the pull-up node, a first electrode of the tenth transistor is connected to the clock signal terminal, a second electrode of the tenth transistor is connected to the output terminal, and a first terminal of the capacitor is connected to the control electrode of the tenth transistor, a second terminal of the capacitor is connected to the second electrode of the tenth transistor.

In an embodiment, the reset circuit comprises an eleventh transistor, wherein a control electrode of the eleventh transistor is connected to the reset signal terminal, a first electrode of the eleventh transistor is connected to the second voltage terminal, a second electrode of the eleventh transistor is connected to the pull-up node.

In an embodiment, the first pull-down circuit comprises a first transistor and a second transistor, the second pull-down circuit comprises a third transistor and a fourth transistor, the first pull-down control circuit comprises a fifth transistor and a sixth transistor, the second pull-down control circuit comprises a seventh transistor and an eighth transistor, the input circuit comprises a ninth transistor, the output circuit comprises a tenth transistor and a capacitor, and the reset circuit comprises an eleventh transistor, wherein a control electrode of the first transistor and a control electrode of the second transistor are connected to a second electrode of the fifth transistor and a first electrode of the sixth transistor, a second electrode of the first transistor and a second electrode of the second transistor are connected to the second control signal terminal, a first terminal of the first transistor is connected to the pull-up node, and a first electrode of the second transistor is connected to the output terminal, a control electrode of the third transistor and a control electrode of the fourth transistor are connected to a second electrode of the seventh transistor and a first electrode of the eighth transistor, a second electrode of the third transistor and a second electrode of the fourth transistor are connected to a first control signal terminal, a first electrode of the third transistor is connected to the pull-up node, and a first electrode of the fourth transistor is connected to the output terminal, a control electrode and a first electrode of the fifth transistor are connected to the first control signal terminal, a control electrode and a first electrode of the seventh transistor are connected to the second control signal terminal, and a second electrode of the sixth transistor and a second electrode of the eighth transistor are connected to the second control signal terminal, and a second electrode of the sixth transistor and a second electrode of the eighth transistor are connected to the pull-down signal terminal, a control electrode of the eleventh transistor is connected to the reset signal terminal, a first electrode of the eleventh transistor is connected to the second voltage terminal, and a second electrode of the ninth transistor and a second electrode of the eleventh transistor are connected to the pull-up node, a control electrode of the tenth transistor is connected to the pull-up node, a first electrode of the tenth transistor is connected to the clock signal terminal, a second electrode of the tenth transistor is connected to the output terminal, and a first terminal of the capacitor is connected to the control electrode of the tenth transistor, a second terminal of the capacitor is connected to the second electrode of the tenth transistor.

According to another aspect of this disclosure, a control method for driving any one of the above shift register units is provided. The method comprises: in a charging stage, with the input terminal outputting an input signal, the first voltage terminal outputting a first voltage signal, outputting a pre-output signal to the pull-up node based on the input signal and the first voltage signal by the inputting circuit; in an output stage, with the clock signal terminal outputting a clock signal, the output circuit controlling a potential of the output terminal based on the clock signal and a potential of the pull-up node by the output circuit; in a reset stage, with the reset signal terminal outputting a reset signal, the second voltage terminal outputting a second voltage signal, outputting a pre-reset signal to the pull-up node based on the reset signal and the second voltage signal by the reset circuit; in a denoising stage, wtih the first control signal terminal outputting a first control signal, the pull-down signal terminal outputting a pull-down signal, the second control signal terminal outputting a second control signal, outputting a third control signal to the first pull-down circuit based on the first control signal, the pull-down signal and the potential of the pull-up node by the first pull-down control circuit, and outputting a fourth control signal to the second pull-down circuit based on the second control signal, the pull-down signal and the potential of the pull-up node by the second pull-down control circuit, wherein the first pull-down circuit and the second pull-down circuit are alternatingly switched on in response to the third control signal and the fourth control signal, wherein the first pull-down circuit is switched on in response to the third control signal and controls potentials of the pull-up node and the output terminal based on the second control signal; alternatively, the second pull-down circuit is switched on in response to the fourth control signal and controls potentials of the pull-up node and the output terminal based on the first control signal.

In an embodiment, the first control signal has a first level, and the second control signal has a second level, or the first control signal has a second level, and the second control signal has a first level, wherein the first level and the second level alternate periodically to control the third control signal and the fourth control signal to alternate periodically.

In an embodiment, a polarity alternating period of the first control signal and the second control signal is an integer multiple of a driving period of a frame of picture.

According to yet another aspect of this disclosure, a gate drive circuit is provided. The gate drive circuit comprises at least three shift register units as mentioned above, and the shift register units are connected in cascade; wherein an input terminal of the N-th stage shift register unit is connected to an output terminal of the (N−1)-th stage shift register unit, a reset signal terminal of the N-th stage shift register unit is connected to an output terminal of the (N+1)-th stage shift register unit; alternatively, an input terminal of the N-th stage shift register unit is connected to an output terminal of the (N+1)-th stage shift register unit, and a reset signal terminal of the N-th stage shift register unit is connected to an output terminal of the (N−1)-th stage shift register unit.

According to still another aspect of this disclosure, a display substrate is provided, comprising the gate drive circuit mentioned above.

According to yet another aspect of this disclosure, a display device is provided, comprising the display substrate mentioned above.

According to the shift register unit, the control method thereof, the gate drive circuit, the display substrate and the display device provided in the embodiments of this disclosure, a first pull-down circuit and a second pull-down circuit are arranged in the shift register unit, and in response to a first control signal and a second control signal, the first pull-down circuit and the second pull-down circuit can operate alternatingly such that the threshold voltage shift problem of the TFTs in the first pull-down circuit and the second pull-down circuit can be corrected and thus the current leakage characteristics of the TFTs can be improved.

DETAILED DESCRIPTION OF EMBODIMENTS

To illustrate the goals, the technical solutions and the advantages of this disclosure clearly, this disclosure will be described below in detail with reference to the drawings and in combination with specific embodiments.

It should be noted that the terms "first" and "second" used in embodiments of this disclosure are both provided for distinguishing two different entities or parameters having the same title, so the terms "first" and "second" are only adopted for the convenience of expression and should not be construed as limiting the embodiments of this disclosure.

The inventors of this disclosure found at least the following problem in the related art: in a shift register unit of a GOA according to the related art, the pull-down TFT (thin film transistor) is in an on state most of the time, and a voltage difference between the gate and the source is VGS>0V. Long-time forward bias will lead to a forward shift of the threshold voltage Vth. For a general a-Si (amorphous silicon) TFT, the Vth shift amount caused by long-time forward bias is small, but for an oxide TFT (e.g., a-IGZO TFT), due to the influence of process, the back channel is apt to have defects which trap electrons or re-distribute charges under the effect of bias, so the Vth of the TFT varies considerably, and the forward shift of the Vth will cause the on-state current Ion of the TFT in an on state to decrease rapidly and the output stability of the GOA to deteriorate, which may probably give rise to defects such as multi-output or jitter in long-time operation.

In order to solve the above problem, according to one aspect of this disclosure, a shift register unit is provided.

Figure 1:
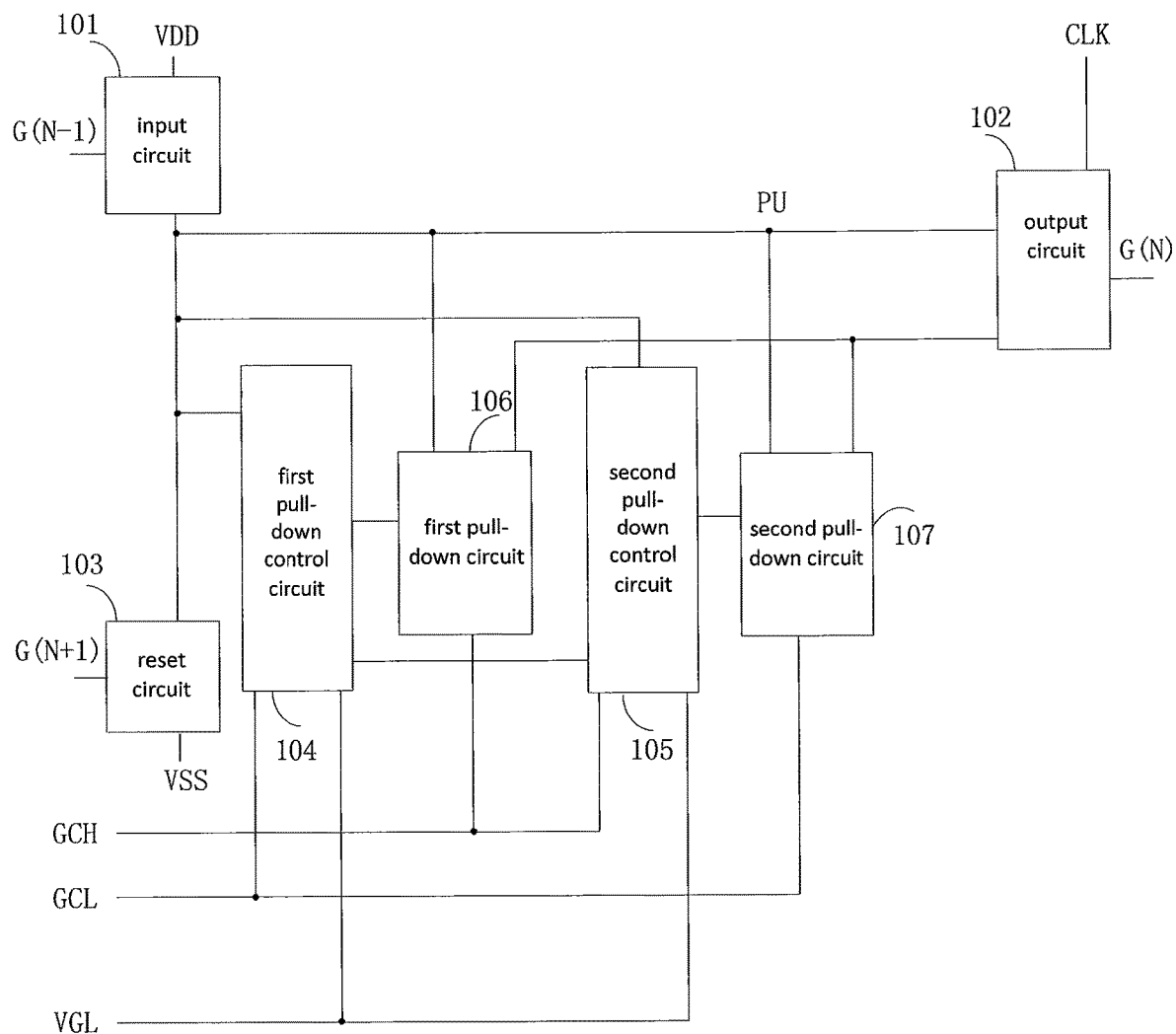
FIG. 1 is a schematic structure view of an embodiment of the shift register unit provided in this disclosure.

FIG. 1 shows a schematic structure view of an embodiment of the shift register unit provided in this disclosure.

As shown in FIG. 1, the shift register unit comprises an input circuit 101, an output circuit 102, a reset circuit 103, a first pull-down control circuit 104, a second pull-down control circuit 105, a first pull-down circuit 106 and a second pull-down circuit 107.

The input circuit 101 is connected to an input terminal G(N−1), a first voltage terminal VDD and a pull-up node PU, and is configured to output a pre-output signal to the pull-up node PU based on an input signal from the input terminal G(N−1) and a first voltage signal from the first voltage terminal VDD.

The output circuit 102 is connected to a clock signal terminal CLK and the pull-up node PU, and is configured to control a potential of the output terminal G(N) based on a clock signal from the clock signal terminal CLK and a potential of the pull-up node PU.

The reset circuit 103 is connected to a reset signal terminal G(N+1), a second voltage terminal VSS and the pull-up node PU, and is configured to output a pre-reset signal to the pull-up node PU based on a reset signal from the reset signal terminal G(N+1) and a second voltage signal from the second voltage terminal VSS, to control the potential of the pull-up node PU.

The first pull-down control circuit 104 is connected to a first control signal terminal GCL, a pull-down signal terminal VGL and the pull-up node PU, and is configured to output a third control signal to the first pull-down circuit 106 based on a first control signal from the first control signal terminal GCL, a pull-down signal from the pull-down signal terminal VGL and the potential of the pull-up node, to control the first pull-down circuit 106 to be switched on or off.

The second pull-down control circuit 105 is connected to a second control signal terminal GCH, a pull-down signal terminal VGL and the pull-up node PU, and is configured to output a fourth control signal to the second pull-down circuit 107 based on a second control signal from the second control signal terminal GCH, a pull-down signal from the pull-down signal terminal VGL and the potential of the pull-up node, to control the second pull-down circuit 107 to be switched on or off.

The first pull-down circuit 106 is connected to the second control signal terminal GCH, the first pull-down control circuit 104, the pull-up node PU and the output terminal G(N), and is configured to control potentials of the pull-up node PU and the output terminal G(N) based on the second control signal responsive to the first pull-down circuit 106 being switched on by the third control signal.

The second pull-down circuit 107 is connected to the first control signal terminal GCL, the second pull-down control circuit 105, the pull-up node PU and the output terminal G(N), and is configured to control potentials of the pull-up node PU and the output terminal G(N) based on the first control signal responsive to the second pull-down circuit 107 being switched on by the fourth control signal.

The first pull-down circuit 106 and the second pull-down circuit 107 are alternatingly switched on.

As can be seen from the above embodiment, a first pull-down circuit and a second pull-down circuit are arranged in the shift register unit provided in the embodiment of this disclosure, and in response to a first control signal and a second control signal, the first pull-down circuit and the second pull-down circuit can operate alternatingly such that the threshold voltage shift problem of the TFTs in the first pull-down circuit and the second pull-down circuit can be corrected and thus the current leakage characteristics of the TFTs can be improved.

The first control signal inputted from the first control signal terminal GCL and the second control signal inputted from the second control signal terminal GCH have opposite phases, and the first control signal and the second control signal have a same period. In an embodiment, an alternating period of the first control signal and the second control signal is an integer multiple of a driving period of a frame of picture, and can be 2 s for example. By alternating the polarities of the control signals periodically, the threshold voltage shift problem of TFTs in the pull-down circuit can be well corrected.

It should be noted that the first control signal and the second control signal can also be the same when applied to different types of transistors.

Figure 2:
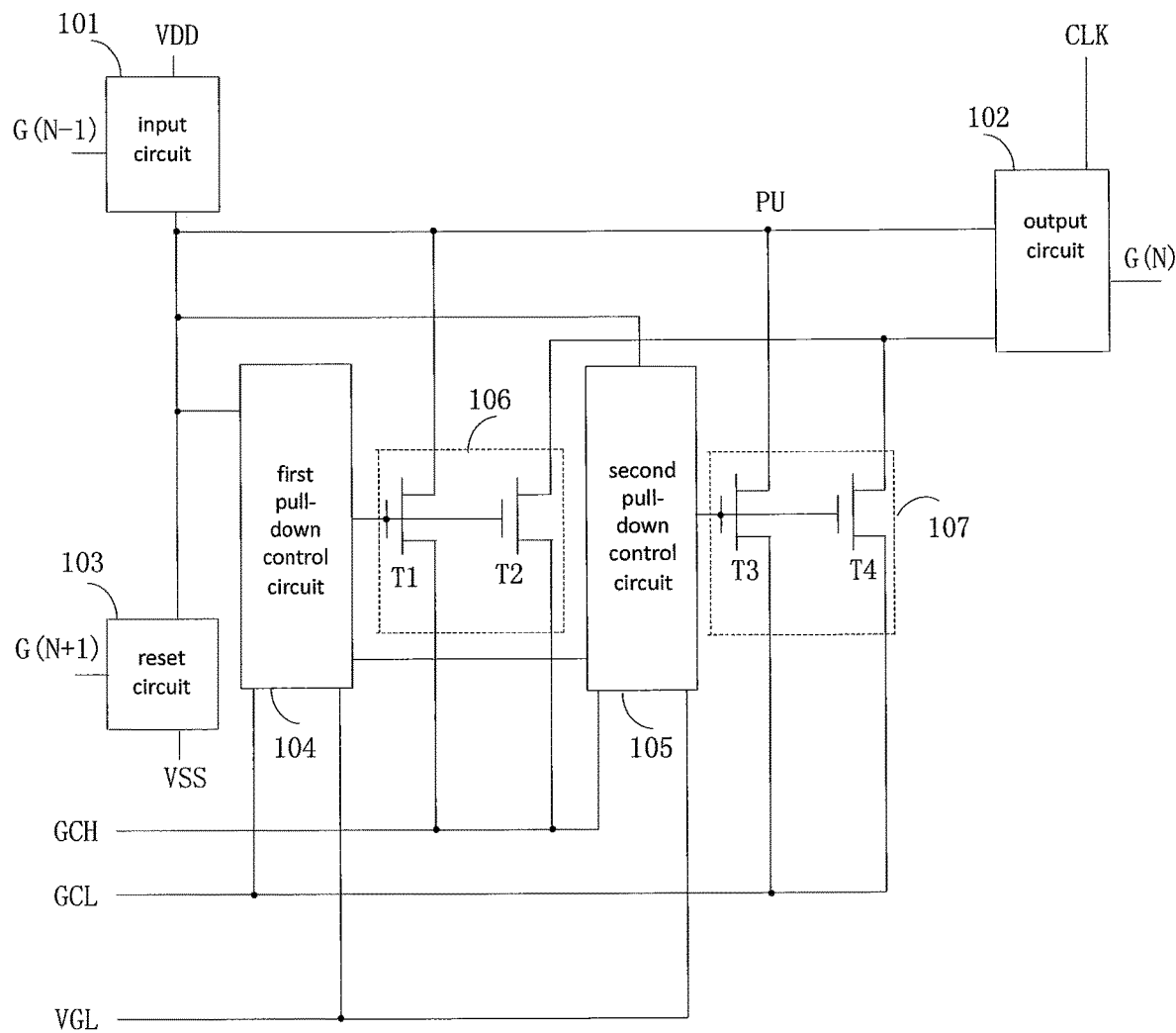
FIG. 2 is a schematic structure view of another embodiment of the shift register unit provided in this disclosure.

FIG. 2 is a schematic structure view of another embodiment of the shift register unit provided in this disclosure.

As shown in FIG. 2, the shift register unit comprises an input circuit 101, an output circuit 102, a reset circuit 103, a first pull-down control circuit 104, a second pull-down control circuit 105, a first pull-down circuit 106 and a second pull-down circuit 107.

The input circuit 101 is connected to an input terminal G(N−1), a first voltage terminal VDD and a pull-up node PU, and is configured to output a pre-output signal to the pull-up node PU based on an input signal from the input terminal G(N−1) and a first voltage signal from the first voltage terminal VDD.

The output circuit 102 is connected to a clock signal terminal CLK and the pull-up node PU, and is configured to control a potential of the output terminal G(N) based on a clock signal from the clock signal terminal CLK and a potential of the pull-up node PU.

The reset circuit 103 is connected to a reset signal terminal G(N+1), a second voltage terminal VSS and the pull-up node PU, and is configured to output a pre-reset signal to the pull-up node PU based on a reset signal from the reset signal terminal G(N+1) and a second voltage signal from the second voltage terminal VSS, to control the potential of the pull-up node PU.

The first pull-down control circuit 104 is connected to a first control signal terminal GCL, a pull-down signal terminal VGL and the pull-up node PU, and is configured to output a third control signal to the first pull-down circuit 106 based on a first control signal from the first control signal terminal GCL, a pull-down signal from the pull-down signal terminal VGL and the potential of the pull-up node PU, to control the first pull-down circuit 106 to be switched on or off.

The second pull-down control circuit 105 is connected to a second control signal terminal GCH, a pull-down signal terminal VGL and the pull-up node PU, and is configured to output a fourth control signal to the second pull-down circuit 107 based on a second control signal from the second control signal terminal GCH, a pull-down signal from the pull-down signal terminal VGL and the potential of the pull-up node PU, to control the second pull-down circuit 107 to be switched on or off.

The first pull-down circuit 106 is connected to the second control signal terminal GCH, the first pull-down control circuit 104, the pull-up node PU and the output terminal G(N), and is configured to control potentials of the pull-up node PU and the output terminal G(N) based on the second control signal responsive to the first pull-down circuit 106 being switched on by the third control signal.

Specifically, the first pull-down circuit 106 can further comprise a first transistor T1 and a second transistor T2. A control electrode of the first transistor T1 is connected to the first pull-down control circuit 104, a first electrode of the first transistor T1 is connected to the pull-up node PU, a second electrode of the first transistor T1 is connected to the second control signal terminal GCH. A control electrode of the second transistor T2 is connected to the first pull-down control circuit 104, a first electrode of the second transistor T2 is connected to the output terminal G(N), a second electrode of the second transistor T2 is connected to the second control signal terminal GCH.

The second pull-down circuit 107 is connected to the first control signal terminal GCL, the second pull-down control circuit 105, the pull-up node PU and the output terminal G(N), and is configured to control potentials of the pull-up node PU and the output terminal G(N) based on the first control signal responsive to the second pull-down circuit 107 being switched on by the fourth control signal.

Specifically, the second pull-down circuit 107 can further comprise a third transistor T3 and a fourth transistor T4. A control electrode of the third transistor T3 is connected to the second pull-down control circuit 105, a first electrode of the third transistor T3 is connected to the pull-up node PU, a second electrode of the third transistor T3 is connected to the first control signal terminal GCL. A control electrode of the fourth transistor T4 is connected to the second pull-down control circuit 105, a first electrode of the fourth transistor T4 is connected to the output terminal G(N), a second electrode of the fourth transistor T4 is connected to the first control signal terminal GCL.

The first pull-down circuit 106 and the second pull-down circuit 107 are alternatingly switched on in response to the third control signal and the fourth control signal.

The first control signal inputted from the first control signal terminal GCL and the second control signal inputted from the second control signal terminal GCH have opposite phases, and the first control signal and the second control signal have a same period, to control the third control signal and the fourth control signal to alternate periodically. An alternating period of the first control signal and the second control signal is an integer multiple of a driving period of a frame of picture. In this way, with two groups of pull-down TFTs whose voltage differences VGSs between the gate and the source have opposite polarities, and in cooperation with a time-divisional drive solution of the two groups of pull-down TFTs (i.e., the first control signal and the second control signal alternate periodically), the Vth shift of the pull-down TFTs can be corrected and the current leakage characteristics of the pull-down TFTs can be improved.

It should be noted that the first control signal and the second control signal can also be the same when applied to different types of transistors.

Figure 3:
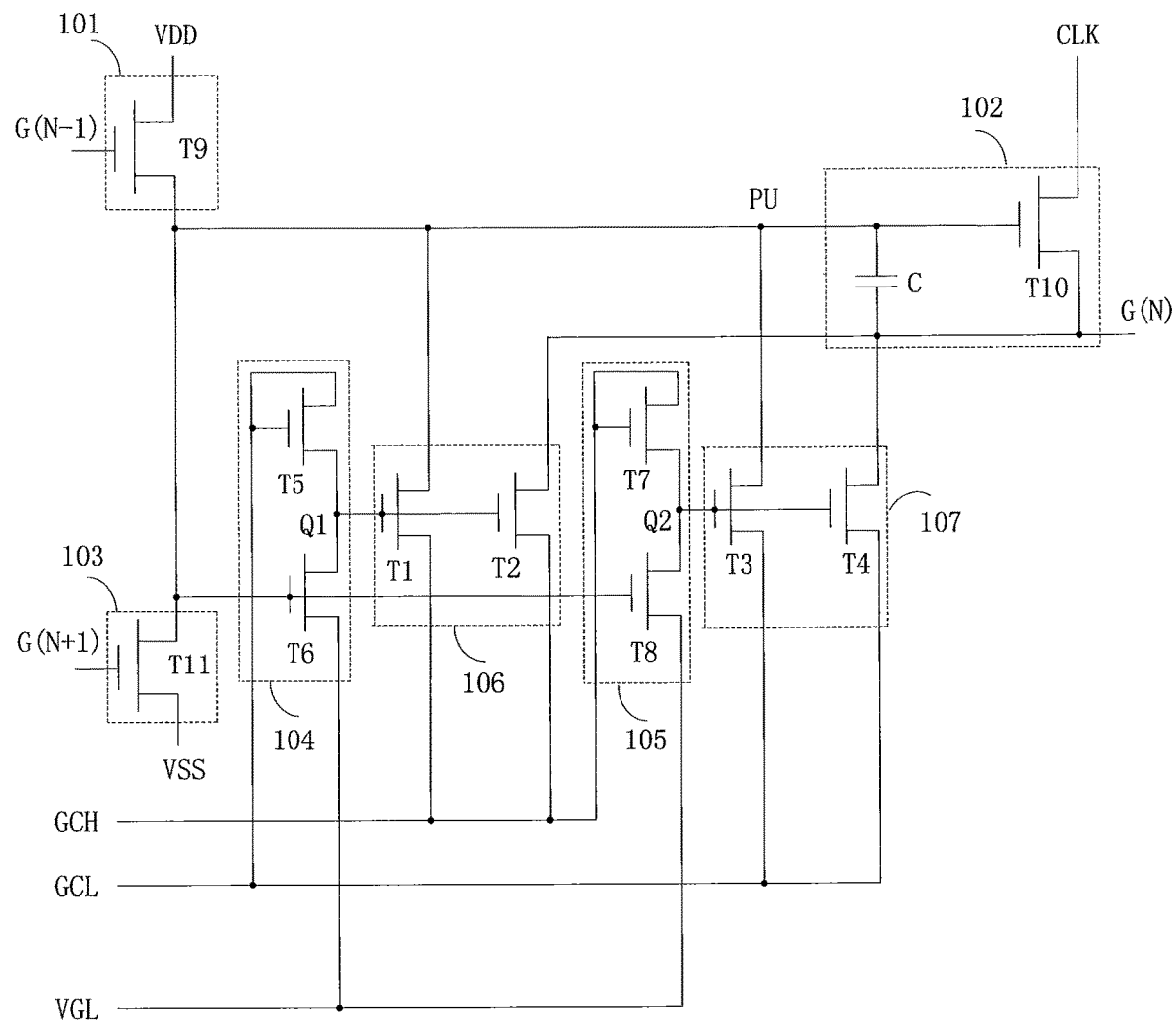
FIG. 3 is a schematic structure view of yet another embodiment of the shift register unit provided in this disclosure.

FIG. 3 is a schematic structure view of yet another embodiment of the shift register unit provided in this disclosure.

As shown in FIG. 3, the shift register unit comprises an input circuit 101, an output circuit 102, a reset circuit 103, a first pull-down control circuit 104, a second pull-down control circuit 105, a first pull-down circuit 106 and a second pull-down circuit 107.

The input circuit 101 is connected to an input terminal G(N−1), a first voltage terminal VDD and a pull-up node PU, and is configured to output a pre-output signal to the pull-up node PU based on an input signal from the input terminal G(N−1) and a first voltage signal from the first voltage terminal VDD.

Specifically, the input circuit 101 further comprises a ninth transistor T9. A control electrode of the ninth transistor T9 is connected to the input terminal G(N−1), a first electrode of the ninth transistor T9 is connected to the first voltage terminal VDD, a second electrode of the ninth transistor T9 is connected to the pull-up node PU.

The output circuit 102 is connected to a clock signal terminal CLK and the pull-up node PU, and is configured to control a potential of the output terminal G(N) based on a clock signal from the clock signal terminal CLK and a potential of the pull-up node PU.

Specifically, the output circuit 102 further comprises a tenth transistor T10 and a capacitor C. A control electrode of the tenth transistor T10 is connected to the pull-up node PU, a first electrode of the tenth transistor T10 is connected to the clock signal terminal CLK, and a second electrode of the tenth transistor T10 outputs the output signal to the output terminal G(N). A first terminal of the capacitor C is connected to the control electrode of the tenth transistor T10, and a second terminal of the capacitor C is connected to the second electrode of the tenth transistor T10.

The reset circuit 103 is connected to a reset signal terminal G(N+1), a second voltage terminal VSS and the pull-up node PU, and is configured to output a pre-reset signal to the pull-up node PU based on a reset signal from the reset signal terminal G(N+1) and a second voltage signal from the second voltage terminal VSS, to control the potential of the pull-up node PU.

Specifically, the reset circuit 103 further comprises an eleventh transistor T11. A control electrode of the eleventh transistor T11 is connected to the reset signal terminal G(N+1), a first electrode of the eleventh transistor T11 is connected to the second voltage terminal VSS, and a second electrode of the eleventh transistor T11 is connected to the pull-up node PU.

The first pull-down control circuit 104 is connected to a first control signal terminal GCL, a pull-down signal terminal VGL and the pull-up node PU, and is configured to output a third control signal to the first pull-down circuit 106 based on a first control signal from the first control signal terminal GCL, a pull-down signal from the pull-down signal terminal VGL and the potential of the pull-up node PU, to control the first pull-down circuit 106 to be switched on or off.

Specifically, the first pull-down control circuit 104 further comprises a fifth transistor T5 and a sixth transistor T6. A control electrode and a first electrode of the fifth transistor T5 are both connected to the first control signal terminal GCL, and a second electrode of the fifth transistor T5 is connected to the first pull-down circuit 106. A control electrode of the sixth transistor T6 is connected to the pull-up node PU, a first electrode of the sixth transistor T6 is connected to the first pull-down circuit 106, and a second electrode of the sixth transistor T6 is connected to the pull-down signal terminal VGL.

The second pull-down control circuit 105 is connected to a second control signal terminal GCH, a pull-down signal terminal VGL and the pull-up node PU, and is configured to output a fourth control signal to the second pull-down circuit 107 based on a second control signal from the second control signal terminal GCH, a pull-down signal from the pull-down signal terminal VGL and the potential of the pull-up node PU, to control the second pull-down circuit 107 to be switched on or off.

Specifically, the second pull-down control circuit 105 further comprises a seventh transistor T7 and an eighth transistor T8. A control electrode and a first electrode of the seventh transistor T7 are both connected to the second control signal terminal GCH, and a second electrode of the seventh transistor T7 is connected to the second pull-down circuit 107. A control electrode of the eighth transistor T8 is connected to the pull-up node PU, a first electrode of the eighth transistor T8 is connected to the second pull-down circuit 107, and a second electrode of the eighth transistor T8 is connected to the pull-down signal terminal VGL.

The first pull-down circuit 106 is connected to the second control signal terminal GCH, the first pull-down control circuit 104, the pull-up node PU and the output terminal G(N), and is configured to control potentials of the pull-up node PU and the output terminal G(N) based on the second control signal responsive to the first pull-down circuit 106 being switched on by the third control signal.

Specifically, the first pull-down circuit 106 can further comprise a first transistor T1 and a second transistor T2. A control electrode of the first transistor T1 is connected to the first pull-down control circuit 104, a first electrode of the first transistor T1 is connected to the pull-up node PU, and a second electrode of the first transistor T1 is connected to the second control signal terminal GCH. A control electrode of the second transistor T2 is connected to the first pull-down control circuit 104, a first electrode of the second transistor T2 is connected to the output terminal G(N), and a second electrode of the second transistor T2 is connected to the second control signal terminal GCH.

The second pull-down circuit 107 is connected to the first control signal terminal GCL, the second pull-down control circuit 105, the pull-up node PU and the output terminal G(N), and is configured to control potentials of the pull-up node PU and the output terminal G(N) based on the first control signal responsive to the second pull-down circuit 107 being switched on by the fourth control signal.

Specifically, the second pull-down circuit 107 further comprises a third transistor T3 and a fourth transistor T4. A control electrode of the third transistor T3 is connected to the second pull-down control circuit 105, a first electrode of the third transistor T3 is connected to the pull-up node PU, and a second electrode of the third transistor T3 is connected to the first control signal terminal GCL. A control electrode of the fourth transistor T4 is connected to the second pull-down control circuit 105, a first electrode of the fourth transistor T4 is connected to the output terminal G(N), and a second electrode of the fourth transistor T4 is connected to the first control signal terminal GCL.

The first pull-down circuit 106 and the second pull-down circuit 107 are alternatingly switched on in a time-divisional manner in response to the third control signal and the fourth control signal.

In this way, the first transistor T1 and the second transistor T2 form a group of pull-down TFTs, and the third transistor T3 and the fourth transistor T4 form another group of pull-down TFTs. The ON and OFF of the fifth transistor T5 and the sixth transistor T6 can adjust the potential of Q1, and the ON and OFF of the seventh transistor T7 and the eighth transistor T8 can adjust the potential of Q2. The potential of Q1 controls the ON and OFF of the firth transistor T1 and the second transistor T2, and the potential of Q2 controls the ON and OFF of the third transistor T3 and the fourth transistor T4.

The input circuit 101 and the reset circuit 103 are symmetrical such that they can be exchanged for use in case of an exchange of the drive signal, i.e., the input circuit 101 is used as a reset circuit and the reset circuit 103 is used as an input circuit, thereby satisfying more drive requirements.

Figure 4:
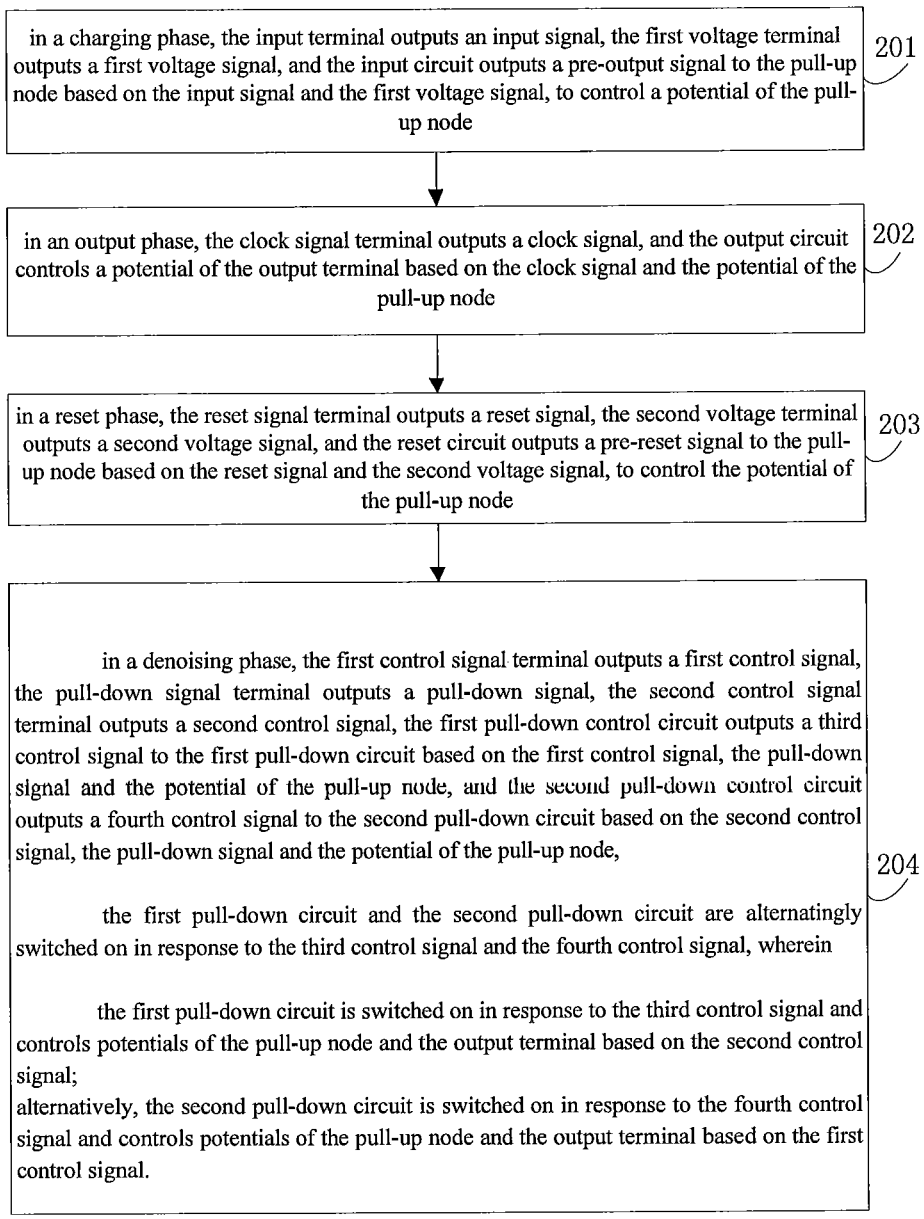
FIG. 4 is a schematic flow chart of an embodiment of the control method for a shift register unit provided in this disclosure.

According to another aspect of this disclosure, a control method for a shift register unit is provided. FIG. 4 is a schematic flow chart of an embodiment of the control method for a shift register unit provided in this disclosure.

As shown in FIG. 4, the control method for a shift register unit is used for driving any one of the shift register units mentioned above. The method comprises the following steps.

In step 201, i.e. in a charging phase, the input terminal G(N−1) outputs an input signal, the first voltage terminal VDD outputs a first voltage signal, and the input circuit 101 outputs a pre-output signal to the pull-up node PU based on the input signal and the first voltage signal, to control a potential of the pull-up node PU.

In step 202, i.e. in an output phase, the clock signal terminal CLK outputs a clock signal, and the output circuit 102 controls a potential of the output terminal G(N) based on the clock signal and the potential of the pull-up node PU.

In step 203, i.e. in a reset phase, the reset signal terminal G(N+1) outputs a reset signal, the second voltage terminal VSS outputs a second voltage signal, and the reset circuit 103 outputs a pre-reset signal to the pull-up node PU based on the reset signal and the second voltage signal, to control the potential of the pull-up node PU;

In step 204, i.e. in a denoising phase, the first control signal terminal GCL outputs a first control signal, the pull-down signal terminal VGL outputs a pull-down signal, the second control signal terminal GCH outputs a second control signal, the first pull-down control circuit 104 outputs a third control signal to the first pull-down circuit 106 based on the first control signal, the pull-down signal and the potential of the pull-up node PU, and the second pull-down control circuit 105 outputs a fourth control signal to the second pull-down circuit 107 based on the second control signal, the pull-down signal and the potential of the pull-up node PU.

The first pull-down circuit 106 and the second pull-down circuit 107 are alternatingly switched on in a time-divisional manner in response to the third control signal and the fourth control signal, wherein the first pull-down circuit 106 is switched on in response to the third control signal and controls potentials of the pull-up node PU and the output terminal G(N) based on the second control signal;

alternatively, the second pull-down circuit 107 is switched on in response to the fourth control signal and controls potentials of the pull-up node and the output terminal G(N) based on the first control signal.

The first voltage signal and the second control signal are both first level signals, the second voltage signal and the first control signal are both second level signals; alternatively, the first voltage signal and the first control signal are both first level signals, the second voltage signal and the second control signal are both second level signals. The first level signals and the second level signals are different. It should be noted that the first level signals and the second level signals can also be the same depending on different types of transistors.

As can be seen from the above embodiment, according to the control method for a shift register unit provided in the embodiment of this disclosure, a first pull-down circuit and a second pull-down circuit are arranged in the shift register unit, and in response to a first control signal and a second control signal, the first pull-down circuit and the second pull-down circuit can operate alternatingly such that the threshold voltage shift problem of the TFTs in the first pull-down circuit and the second pull-down circuit can be corrected and thus the current leakage characteristics of the TFTs can be improved.

The first control signal has a first level, and the second control signal has a second level, or the first control signal has a second level, and the second control signal has a first level, wherein the first level and the second level alternate periodically to control the third control signal and the fourth control signal to alternate periodically. An alternating period of the first level and the second level can be an integer multiple of a driving period of a frame of picture.

Figure 5:
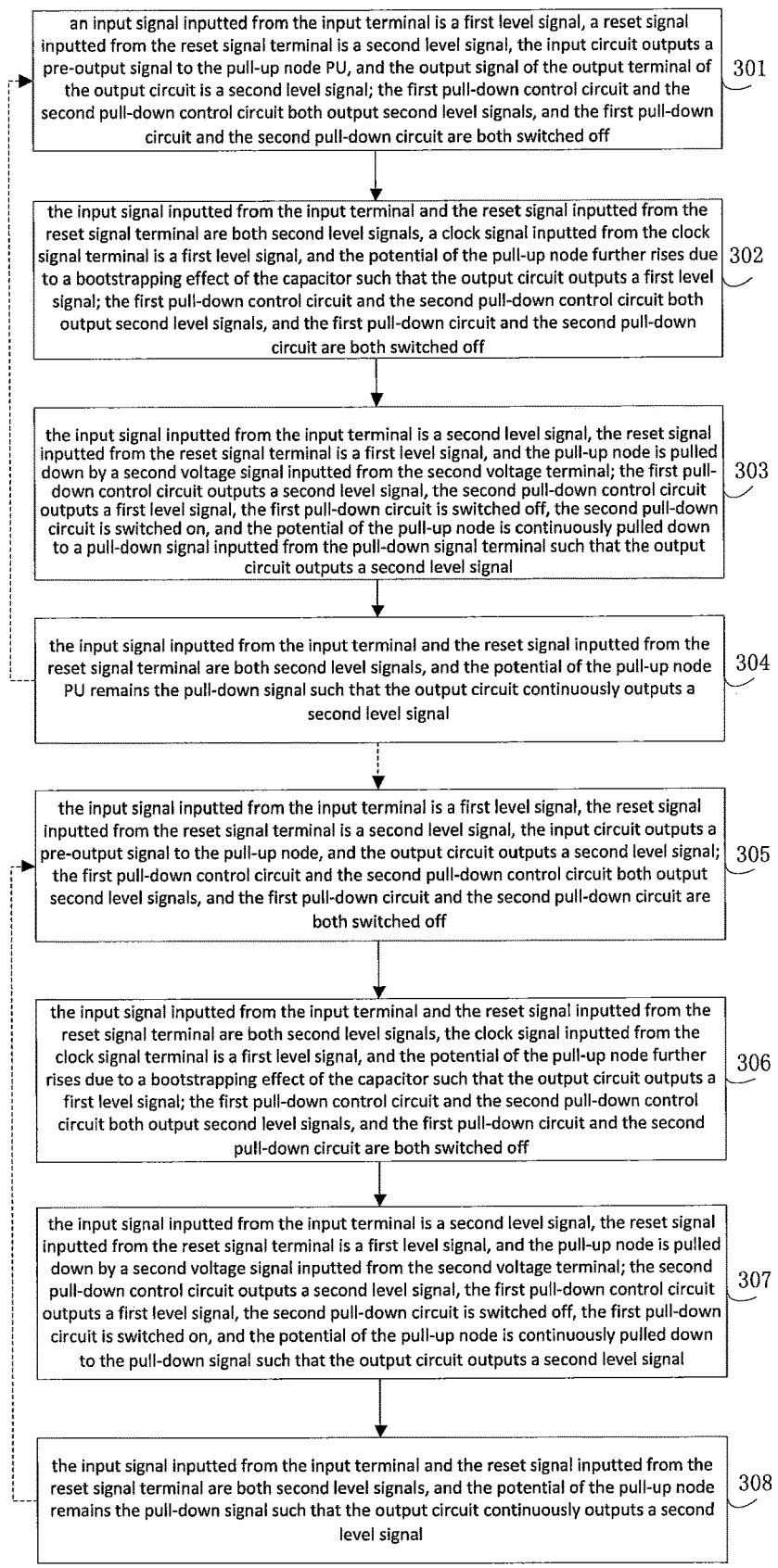
FIG. 5 is a schematic flow chart of another embodiment of the control method for a shift register unit provided in this disclosure.

FIG. 5 is a schematic flow chart of another embodiment of the control method for a shift register unit provided in this disclosure.

As shown in FIG. 5, the control method for a shift register unit is used for driving any one of the shift register units mentioned above. With reference to the timing chart in the left half of FIG. 6, the first voltage signal inputted from the first voltage terminal VDD and the second control signal inputted from the second control signal terminal GCH are both first level signals, and the second voltage signal inputted from the second voltage terminal VSS and the first control signal inputted from the first control signal terminal GCL are both second level signals, and the first level signals are different from the second level signals. The method comprises the following steps.

In step 301, i.e. in an input phase, an input signal (which can be an output signal of a preceding stage shift register unit) inputted from the input terminal G(N−1) is a first level signal, a reset signal (which can be an output signal of a subsequent stage shift register unit) inputted from the reset signal terminal G(N+1) is a second level signal, the input circuit 101 outputs a pre-output signal to the pull-up node PU, and the output signal of the output terminal G(N) of the output circuit 102 is a second level signal; the first pull-down control circuit 104 and the second pull-down control circuit 105 both output second level signals, and the first pull-down circuit 106 and the second pull-down circuit 107 are both switched off; the inputted signal switches on the ninth transistor T9, and the inputted first level signal charges the capacitor C such that the potential of the pull-up node PU is pulled up, which switches on the sixth transistor T6 and the eighth transistor T8, and Q1 and Q2 are at low potentials, and the first transistor T1, the second transistor T2, the third transistor T3 and the fourth transistor T4 are all in an OFF state, which ensures the continuous rise of the potential of the pull-up node PU.

In step 302, i.e. in an output phase, the input signal inputted from the input terminal G(N−1) and the reset signal inputted from the reset signal terminal G(N+1) are both second level signals, a clock signal inputted from the clock signal terminal CLK is a first level signal, and the potential of the pull-up node PU further rises due to a bootstrapping effect of the capacitor C such that the output circuit 102 outputs a first level signal; the first pull-down control circuit 104 and the second pull-down control circuit 105 both output second level signals, and the first pull-down circuit 106 and the second pull-down circuit 107 are both switched off; the inputted signal is at a low level, the ninth transistor T9 is switched off, and the pull-up node PU remains a high potential, the tenth transistor T10 remains in an ON state; the clock signal is at a high level, and the potential of the pull-up node PU continues to rise due to a bootstrapping effect of the capacitor C, the tenth transistor T10 is further switched on such that the output circuit 102 outputs a first level signal; in this phase, Q1 and Q2 remain at low potentials, and the first transistor T1, the second transistor T2, the third transistor T3 and the fourth transistor T4 are all in an OFF state, which ensures the stability of the potential of the pull-up node PU and the output signal.

In step 303, i.e. in a reset phase and a denoising phase, the input signal inputted from the input terminal G(N−1) is a second level signal, the reset signal inputted from the reset signal terminal G(N+1) is a first level signal, and the pull-up node is pulled down by a second voltage signal inputted from the second voltage terminal VSS; the first pull-down control circuit 104 outputs a second level signal, the second pull-down control circuit 105 outputs a first level signal, the first pull-down circuit 106 is switched off, the second pull-down circuit 107 is switched on, and the potential of the pull-up node PU is continuously pulled down to a pull-down signal inputted from the pull-down signal terminal VGL such that the output circuit 102 outputs a second level signal; the reset signal is a first level signal which switches on the eleventh transistor T11, the potential of the pull-up node PU is pulled down and the tenth transistor T10 is switched off; the pull-up node PU is at a low potential such that the sixth transistor T6 and the eighth transistor T8 are switched off, and since the second control signal (GCH) and the first control signal (GCL) are at a high potential and a low potential respectively, Q1 is at a low potential and Q2 is at a high potential such that the third transistor T3 and the fourth transistor T4 are switched on, and the first transistor T1 and the second transistor T2 are switched off; the pull-up node PU is continuously pulled down to the low potential of the pull-down signal by the first control signal via the third transistor T3, and the output signal of the output terminal G(N) is continuously pulled down to the low potential of the pull-down signal by the first control signal via the fourth transistor T4.

In step 304, i.e. in a continuing phase, the input signal inputted from the input terminal G(N−1) and the reset signal inputted from the reset signal terminal G(N+1) are both second level signals, and the potential of the pull-up node PU remains the pull-down signal such that the output circuit 102 continuously outputs a second level signal; the potentials of the pull-up node PU, Q1 and Q2 are the same as they were in the previous stage, and the output signal of the output terminal G(N) remains a low level output until the shift register unit (GOA) of this stage is recharged in the next frame.

Figure 6:
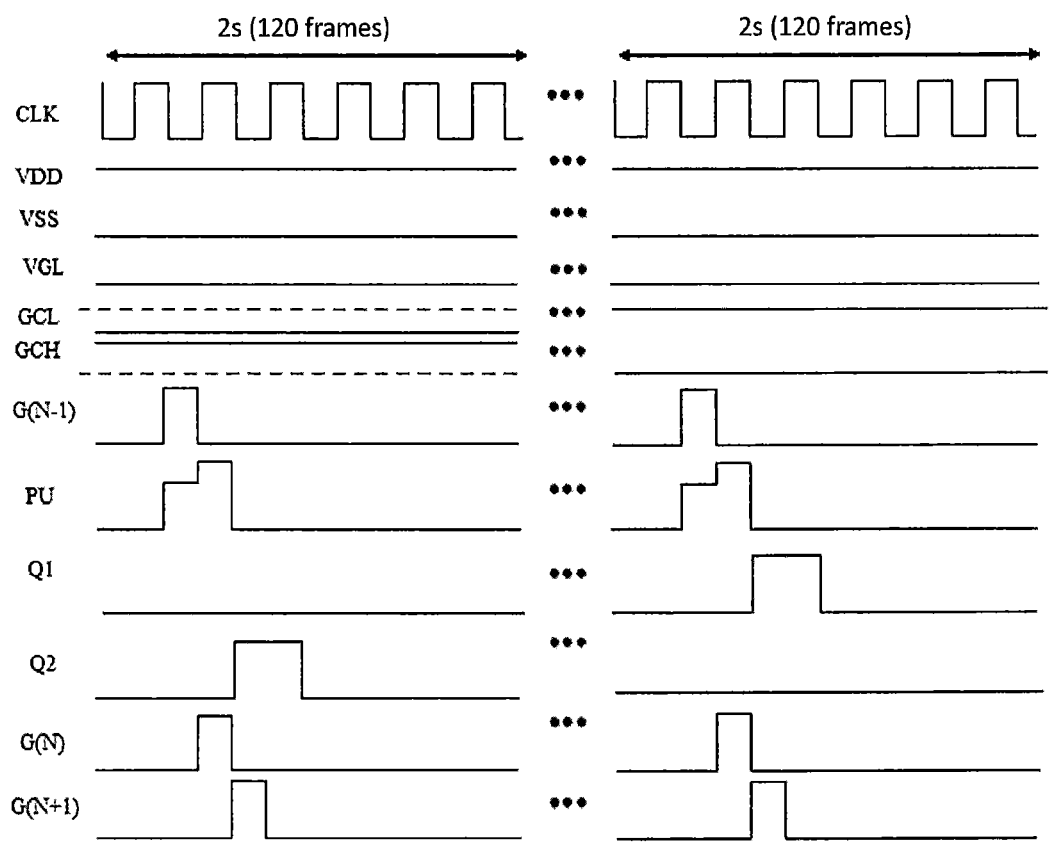
FIG. 6 is a schematic view showing the control timing of an embodiment of the shift register unit provided in this disclosure.

With reference to the timing chart in the right half of FIG. 6, the first voltage signal inputted from the first voltage terminal VDD and the first control signal inputted from the first control signal terminal GCL are both first level signals, the second voltage signal inputted from the second voltage terminal VSS and the second control signal inputted from the second control signal terminal GCH are both second level signals, and the first level signals are different from the second level signals.

In step 305, i.e. in an input phase, the input signal inputted from the input terminal G(N−1) is a first level signal, the reset signal inputted from the reset signal terminal G(N+1) is a second level signal, the input circuit 101 outputs a pre-output signal to the pull-up node PU, and the output circuit 102 outputs a second level signal; the first pull-down control circuit 104 and the second pull-down control circuit 105 both output second level signals, and the first pull-down circuit 106 and the second pull-down circuit 107 are both switched off.

In step 306, i.e. in an output phase, the input signal inputted from the input terminal G(N−1) and the reset signal inputted from the reset signal terminal G(N+1) are both second level signals, the clock signal inputted from the clock signal terminal CLK is a first level signal, and the potential of the pull-up node PU further rises due to a bootstrapping effect of the capacitor C such that the output circuit 102 outputs a first level signal; the first pull-down control circuit 104 and the second pull-down control circuit 105 both output second level signals, and the first pull-down circuit 106 and the second pull-down circuit 107 are both switched off.

In step 307, i.e. in a reset phase and a denoising phase, the input signal inputted from the input terminal G(N−1) is a second level signal, the reset signal inputted from the reset signal terminal G(N+1) is a first level signal, and the pull-up node is pulled down by a second voltage signal inputted from the second voltage terminal VSS; the second pull-down control circuit 105 outputs a second level signal, the first pull-down control circuit 104 outputs a first level signal, the second pull-down circuit 107 is switched off, the first pull-down circuit 106 is switched on, and the potential of the pull-up node PU is continuously pulled down to the pull-down signal such that the output circuit 102 outputs a second level signal.

In step 308, i.e. in a continuing phase, the input signal inputted from the input terminal G(N−1) and the reset signal inputted from the reset signal terminal G(N+1) are both second level signals, and the potential of the pull-up node PU remains the pull-down signal such that the output circuit 102 continuously outputs a second level signal.

The first level and the second level alternate periodically, and an alternating period of the first level and the second level is an integer multiple of a driving period of a frame of picture. By alternating the control signals periodically, the TFTs in the two groups of pull-down circuits can operate alternatingly, and thus the threshold voltage shift problem thereof can be well corrected. As shown in FIG. 5, the alternating period of the first control signal and the second control signal is 2 s, i.e., after driving 120 frames, the potentials of the GCH and the GCL are exchanged. It can be known that, in fact, the period can be set randomly as long as it is an integer multiple of a frame time.

In the former 2s, the first control signal inputted from the first control signal terminal GCL is at a low potential, the second control signal inputted from the second control signal GCH is at a high potential, so Q1 is at a low potential, and Q2 is at a high potential such that the third transistor T3 and the fourth transistor T4 are switched on and the first transistor T1 and the second transistor T2 are switched off. The pull-up node PU is continuously pulled down to the low potential of the pull-down signal by the first control signal via the third transistor T3, and the output signal of the output terminal G(N) is continuously pulled down to the low potential of the pull-down signal by the first control signal via the fourth transistor T4. In this case, the VGS between the third transistor T3 and the fourth transistor T4 is in a forward bias state, and the VGS between the first transistor T1 and the second transistor T2 is in a backward bias state.

In the latter 2s, the first control signal inputted from the first control signal terminal GCL is at a high potential, the second control signal inputted from the second control signal GCH is at a low potentail, so Q1 is at a high potential, and Q2 is at a low potential such that the first transistor T1 and the second transistor T2 are switched on and the third transistor T3 and the fourth transistor T4 are switched off. The pull-up node PU is continuously pulled down to the low potential of the pull-down signal by the second control signal via the first transistor T1, and the output signal of the output terminal G(N) is continuously pulled down to the low potential of the pull-down signal by the second control signal via the second transistor T2. In this case, the VGS between the third transistor T3 and the fourth transistor T4 is in a backward bias state, and the VGS between the first transistor T1 and the second transistor T2 is in a forward bias state.

Therefore, in the shift register unit provided in the embodiment of this disclosure, by alternating the levels of the first control signal and the second control signal periodically, the VGS bias of the two groups of pull-down TFTs, i.e., the first and second transistors T1, T2, and the third and fourth transistors T3, T4, can alternate periodically, which corrects the Vth shift of the pull-down TFTs and improves the current leakage characteristics of the pull-down TFTs.

As can be seen from the above embodiments, according to the control method for a shift register unit provided in the embodiment of this disclosure, a first pull-down circuit and a second pull-down circuit are arranged in the shift register unit, and in response to a first control signal and a second control signal, the first pull-down circuit and the second pull-down circuit can operate alternatingly such that the threshold voltage shift problem of the TFTs in the first pull-down circuit and the second pull-down circuit can be corrected and thus the current leakage characteristics of the TFTs can be improved.

Figure 7:
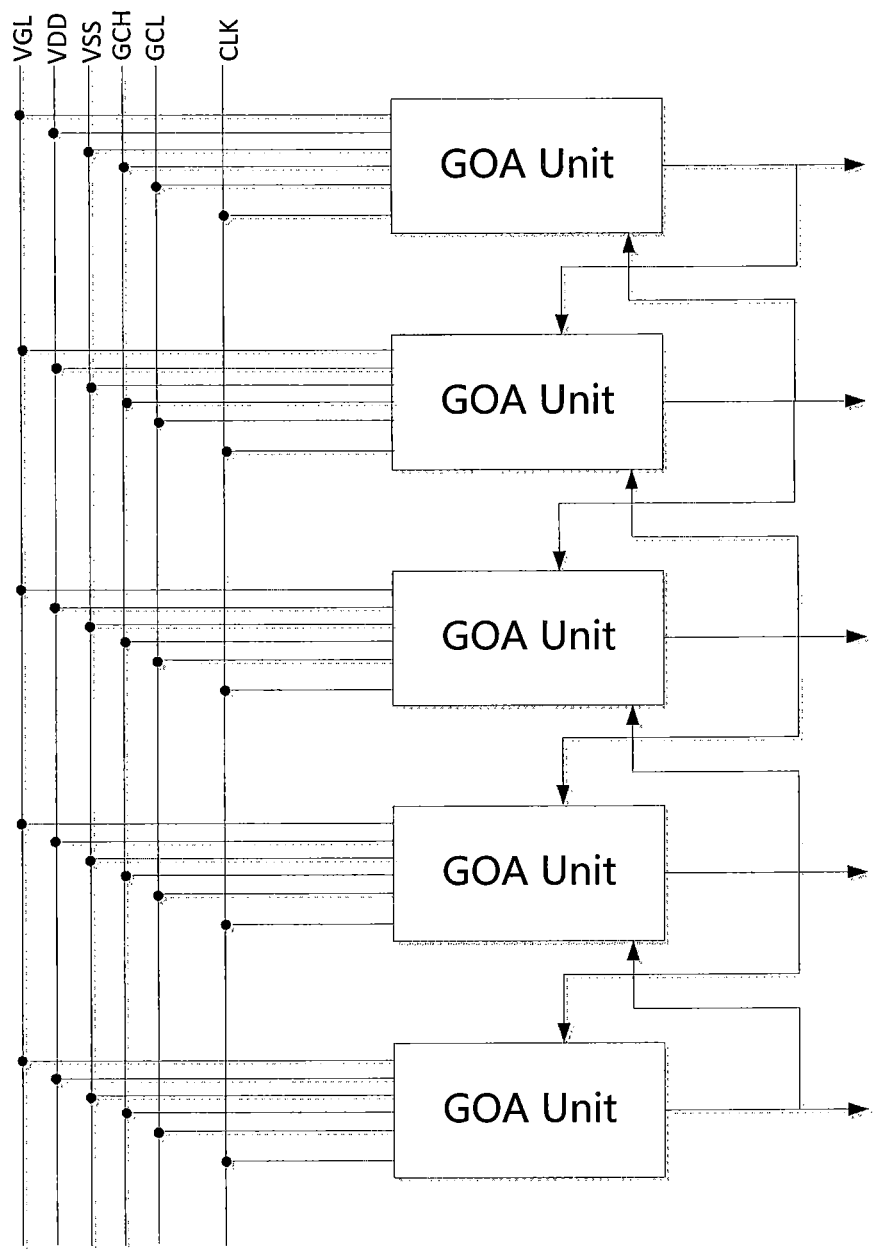
FIG. 7 is a schematic structure view of an embodiment of the gate drive circuit provided in this disclosure.

FIG. 7 is a schematic structure view of an embodiment of the gate drive circuit provided in this disclosure.

As shown in FIG. 7, the gate drive circuit comprises at least three shift register units of any type as mentioned above, the shift register units are connected in cascade. An input terminal of the N-th stage shift register unit is connected to an output terminal of the (N−1)-th stage shift register unit, and a reset signal terminal of the N-th stage shift register unit is connected to an output terminal of the (N+1)-th stage shift register unit.

Alternatively, an input terminal of the N-th stage shift register unit is connected to an output terminal of the (N+1)-th stage shift register unit, and a reset signal terminal of the N-th stage shift register unit is connected to an output terminal of the (N−1)-th stage shift register unit. As compared with the above cascade-connection, in this case, the functions of the input circuit and the reset circuit in the shift register unit are exchanged.

As can be seen from the above embodiment, according to the gate drive circuit provided in the embodiment of this disclosure, a first pull-down circuit and a second pull-down circuit are arranged in the shift register unit, and in response to a first control signal and a second control signal, the first pull-down circuit and the second pull-down circuit can operate alternatingly such that the threshold voltage shift problem of the TFTs in the first pull-down circuit and the second pull-down circuit can be corrected and thus the current leakage characteristics of the TFTs can be improved.

According to still another aspect of this disclosure, an embodiment of a display substrate is provided.

The display substrate comprises the gate drive circuit as mentioned above.

As can be seen from the above embodiment, according to the display substrate provided in the embodiment of this disclosure, a first pull-down circuit and a second pull-down circuit are arranged in the shift register unit, and in response to a first control signal and a second control signal, the first pull-down circuit and the second pull-down circuit can operate alternatingly such that the threshold voltage shift problem of the TFTs in the first pull-down circuit and the second pull-down circuit can be corrected and thus the current leakage characteristics of the TFTs can be improved.

According to yet another aspect of this disclosure, an embodiment of a display device is provided.

The display device comprises the display substrate as mentioned above.

It should be noted that the display device in the embodiment can be any product or component having a display function, such as electronic paper, a cellphone, a tablet computer, a television, a notebook computer, a digital photo frame, a navigator or the like.

As can be seen from the above embodiment, according to the display device provided in the embodiment of this disclosure, a first pull-down circuit and a second pull-down circuit are arranged in the shift register unit, and in response to a first control signal and a second control signal, the first pull-down circuit and the second pull-down circuit can operate alternatingly such that the threshold voltage shift problem of the TFTs in the first pull-down circuit and the second pull-down circuit can be corrected and thus the current leakage characteristics of the TFTs can be improved.

It should be noted that the transistor in each embodiment is independently selected from any of a polysilicon thin film transistor, an amorphous silicon thin film transistor, an oxide thin film transistor and an organic thin film transistor. The "control electrode" mentioned in each embodiment can specifically refer to a gate or a base of a transistor, and the "first electrode" can specifically refer to a source or an emitter of the transistor, and correspondingly, the "second electrode" can specifically refer to a drain or a collector of the transistor. Obviously, those skilled in the art should understand that the "first electrode" and the "second electrode" can be exchanged.

The transistors adopted in each embodiment of this disclosure can all be thin film transistors or field effect transistors or other devices having the same characteristics. In the embodiments of this disclosure, in order to distinguish the two electrodes other than the gate of a transistor, one of the two electrodes is called a first electrode, and the other is called a second electrode. Besides, according to the characteristics of transistors, the transistors can be divided into N-type transistors or P-type transistors. In the drive circuits provided in the embodiments of this disclosure, all transistors are illustrated by taking N-type transistors as an example, and those skilled in the art can easily conceive of adopting P-type transistors for the implementation on the premise that no inventive efforts are made, which also falls within the protection scope of this disclosure.

In the embodiments of this disclosure, for an N-type transistor, the first electrode is a source, the second electrode is a drain, and for a P-type transistor, the first electrode is a drain, the second electrode is a source.

One of ordinary skills in the art should understand that the above description is only specific embodiments of this disclosure and should not limit this disclosure, and any amendment, equivalent replacement, and improvement made within the spirit and principle of this disclosure should fall within the protection scope of this disclosure.

The invention claimed is:

1. A shift register unit, comprising:
   an input circuit;
   a reset circuit;
   an output circuit;
   a first pull-down control circuit;
   a second pull-down control circuit;
   a first pull-down circuit; and
   a second pull-down circuit,
   wherein the input circuit is connected to an input terminal, a first voltage terminal and a pull-up node, and is configured to output a pre-output signal to the pull-up node based on an input signal from the input terminal and a first voltage signal from the first voltage terminal, wherein the output circuit is connected to an output terminal, a clock signal terminal and the pull-up node, and is configured to control a potential of the output terminal based on a clock signal from the clock signal terminal and a potential of the pull-up node, wherein the reset circuit is connected to a reset signal terminal, a second voltage terminal and the pull-up node, and is configured to output a pre-reset signal to the pull-up node based on a reset signal from the reset signal terminal and a second voltage signal from the second voltage terminal, wherein the first pull-down control circuit is connected to a first control signal terminal, a pull-down signal terminal and the pull-up node, and is configured to output a third control signal to the first pull-down circuit based on a first control signal from the first control signal terminal, a pull-down signal from the pull-down signal terminal and the potential of the pull-up node, to control the first pull-down circuit to be switched on or off, wherein the second pull-down control circuit is connected to a second control signal terminal, a pull-down signal terminal and the pull-up node, and is configured to output a fourth control signal to the second pull-down circuit based on a second control signal from the second control signal terminal, the pull-down signal from the pull-down signal terminal and the potential of the pull-up node, to control the second pull-down circuit to be switched on or off, wherein the first pull-down circuit is connected to the second control signal terminal, the first pull-down control circuit, the pull-up node and the output terminal, and is configured to control the potential of the pull-up node and the potential of the output terminal based on the second control signal responsive to the first pull-down circuit being switched on by the third control signal, wherein the second pull-down circuit is connected to the first control signal terminal, the second pull-down control circuit, the pull-up node and the output terminal, and is configured to control the potential of the pull-up node and the potential of the output terminal based on the first control signal responsive to the second pull-down circuit being switched on by the fourth control signal, and wherein the first pull-down circuit and the second pull-down circuit are configured to be alternatingly switched on.

2. The shift register unit according to claim 1, wherein the first control signal and the second control signal have opposite phases, and the first control signal and the second control signal have a same period.

3. The shift register unit according to claim 1,
wherein the first pull-down circuit comprises a first transistor and a second transistor,
wherein a control electrode of the first transistor is connected to the first pull-down control circuit, a first electrode of the first transistor is connected to the pull-up node, and a second electrode of the first transistor is connected to the second control signal terminal, and
wherein a control electrode of the second transistor is connected to the first pull-down control circuit, a first electrode of the second transistor is connected to the output terminal, and a second electrode of the second transistor is connected to the second control signal terminal.

4. The shift register unit according to claim 1,
wherein the second pull-down circuit comprises a third transistor and a fourth transistor,
wherein a control electrode of the third transistor is connected to the second pull-down control circuit, a first electrode of the third transistor is connected to the pull-up node, and a second electrode of the third transistor is connected to the first control signal terminal, and
wherein a control electrode of the fourth transistor is connected to the second pull-down control circuit, a first electrode of the fourth transistor is connected to the output terminal, and a second electrode of the fourth transistor is connected to the first control signal terminal.

5. The shift register unit according to claim 1,
wherein the first pull-down control circuit comprises a fifth transistor and a sixth transistor,
wherein a control electrode and a first electrode of the fifth transistor are both connected to the first control signal terminal, and a second electrode of the fifth transistor is connected to the first pull-down circuit, and
wherein a control electrode of the sixth transistor is connected to the pull-up node, a first electrode of the sixth transistor is connected to the first pull-down circuit, and a second electrode of the sixth transistor is connected to the pull-down signal terminal.

6. The shift register unit according to claim 1,
wherein the second pull-down control circuit comprises a seventh transistor and an eighth transistor,
wherein a control electrode and a first electrode of the seventh transistor are both connected to the second control signal terminal, and a second electrode of the seventh transistor is connected to the second pull-down circuit, and
wherein a control electrode of the eighth transistor is connected to the pull-up node, a first electrode of the eighth transistor is connected to the second pull-down circuit, and a second electrode of the eighth transistor is connected to the pull-down signal terminal.

7. The shift register unit according to claim 1,
wherein the input circuit comprises a ninth transistor, and
wherein a control electrode of the ninth transistor is connected to the input terminal, a first electrode of the ninth transistor is connected to the first voltage terminal, and a second electrode of the ninth transistor is connected to the pull-up node.

8. The shift register unit according to claim 1,
wherein the output circuit comprises a tenth transistor and a capacitor,
wherein a control electrode of the tenth transistor is connected to the pull-up node, a first electrode of the tenth transistor is connected to the clock signal terminal, and a second electrode of the tenth transistor is connected to the output terminal, and
wherein a first terminal of the capacitor is connected to the control electrode of the tenth transistor, and a second terminal of the capacitor is connected to the second electrode of the tenth transistor.

9. The shift register unit according to claim 1,
wherein the reset circuit comprises an eleventh transistor, and
wherein a control electrode of the eleventh transistor is connected to the reset signal terminal, a first electrode of the eleventh transistor is connected to the second voltage terminal, and a second electrode of the eleventh transistor is connected to the pull-up node.

10. The shift register unit according to claim 1,
wherein the first pull-down circuit comprises a first transistor and a second transistor,
wherein the second pull-down circuit comprises a third transistor and a fourth transistor,
wherein the first pull-down control circuit comprises a fifth transistor and a sixth transistor,
wherein the second pull-down control circuit comprises a seventh transistor and an eighth transistor,
wherein the input circuit comprises a ninth transistor,
wherein the output circuit comprises a tenth transistor and a capacitor, and the reset circuit comprises an eleventh transistor,
wherein a control electrode of the first transistor and a control electrode of the second transistor are connected to a second electrode of the fifth transistor and a first electrode of the sixth transistor,
wherein a second electrode of the first transistor and a second electrode of the second transistor are connected to the second control signal terminal, a first electrode of the first transistor is connected to the pull-up node, and a first electrode of the second transistor is connected to the output terminal,
wherein a control electrode of the third transistor and a control electrode of the fourth transistor are connected to a second electrode of the seventh transistor and a first electrode of the eighth transistor, a second electrode of the third transistor and a second electrode of the fourth transistor are connected to the first control signal terminal, a first electrode of the third transistor is connected to the pull-up node, and a first electrode of the fourth transistor is connected to the output terminal,
wherein a control electrode and a first electrode of the fifth transistor are both connected to the first control signal terminal, a control electrode and a first electrode of the seventh transistor are both connected to the second control signal terminal, and a second electrode of the sixth transistor and a second electrode of the eighth transistor are both connected to the pull-down signal terminal,
wherein a control electrode of the ninth transistor is connected to the input terminal, a first electrode of the ninth transistor is connected to the first voltage terminal, a control electrode of the eleventh transistor is connected to the reset signal terminal, a first electrode of the eleventh transistor is connected to the second voltage terminal, and a second electrode of the ninth transistor and a second electrode of the eleventh transistor are both connected to the pull-up node,
wherein a control electrode of the tenth transistor is connected to the pull-up node, a first electrode of the tenth transistor is connected to the clock signal terminal, and a second electrode of the tenth transistor is connected to the output terminal, and
wherein a first terminal of the capacitor is connected to the control electrode of the tenth transistor, and a second terminal of the capacitor is connected to the second electrode of the tenth transistor.

11. A control method for driving the shift register unit according to claim 1, the control method comprising:
in a charging phase with the input terminal outputting an input signal and the first voltage terminal outputting a first voltage signal, outputting a pre-output signal to the pull-up node based on the input signal and the first voltage signal by the input circuit;
in an output phase with the clock signal terminal outputting a clock signal, controlling a potential of the output terminal based on the clock signal and the potential of the pull-up node by the output circuit;
in a reset phase with the reset signal terminal outputting a reset signal and the second voltage terminal outputting a second voltage signal, outputting a pre-reset signal to the pull-up node based on the reset signal and the second voltage signal by the reset circuit;
in a denoising phase with the first control signal terminal outputting a first control signal, the pull-down signal terminal outputting a pull-down signal, and the second control signal terminal outputting a second control signal, outputting a third control signal to the first pull-down circuit based on the first control signal, the pull-down signal and the potential of the pull-up node by the first pull-down control circuit, and outputting a fourth control signal to the second pull-down circuit based on the second control signal and the pull-down signal and the potential of the pull-up node by the second pull-down control circuit,
wherein the first pull-down circuit and the second pull-down circuit are alternatingly switched on in response to the third control signal and the fourth control signal, and
wherein the first pull-down circuit is switched on in response to the third control signal and controls potentials of the pull-up node and the output terminal based on the second control signal; or
wherein the second pull-down circuit is switched on in response to the fourth control signal and controls potentials of the pull-up node and the output terminal based on the first control signal.

12. The control method according to claim 11,
wherein the first control signal has a first level, and the second control signal has a second level, or the first control signal has the second level, and the second control signal has the first level, and
wherein the first level and the second level alternate periodically to control the third control signal and the fourth control signal to alternate periodically.

13. The control method according to claim 12, wherein an alternating period of the first level and the second level is an integer multiple of a driving period of a frame of picture.

14. A gate drive circuit, comprising:
at least three shift register units according to claim 1, the three shift register units being connected in cascade,
wherein an input terminal of an N-th stage shift register unit of the at least three shift register units is connected to an output terminal of an (N−1)-th stage shift register unit of the at least three shift register units, and a reset signal terminal of the N-th stage shift register unit is connected to an output terminal of the (N+1)-th stage shift register unit; or
an input terminal of the N-th stage shift register unit is connected to an output terminal of the (N+1)-th stage shift register unit, and a reset signal terminal of the N-th stage shift register unit is connected to an output terminal of the (N−1)-th stage shift register unit.

15. A display substrate, comprising the gate drive circuit according to claim 14.

16. A display device, comprising the display substrate according to claim 15.

* * * * *